(12) United States Patent
Qiu et al.

(10) Patent No.: US 10,412,795 B2
(45) Date of Patent: Sep. 10, 2019

(54) POWER MEASUREMENT VIA BOND WIRE COUPLING

(71) Applicant: NXP USA, Inc., Austin, TX (US)

(72) Inventors: Xiaofei Qiu, Tempe, AZ (US); Lionel Mongin, Chandler, AZ (US); Pierre Piel, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 210 days.

(21) Appl. No.: 15/582,367

(22) Filed: Apr. 28, 2017

(65) Prior Publication Data

US 2018/0317288 A1 Nov. 1, 2018

(51) Int. Cl.
*H05B 6/64* (2006.01)
*H03H 7/38* (2006.01)
(Continued)

(52) U.S. Cl.
CPC ........... *H05B 6/6467* (2013.01); *G01R 21/12* (2013.01); *H01L 23/66* (2013.01); *H01L 24/49* (2013.01); *H01P 5/185* (2013.01); *H03F 1/565* (2013.01); *H03F 3/195* (2013.01); *H03F 3/213* (2013.01); *H03H 7/38* (2013.01); *H05B 6/68* (2013.01); *H05B 6/681* (2013.01); *H01L 24/45* (2013.01); *H01L 24/48* (2013.01); *H01L 2223/6611* (2013.01); *H01L 2223/6655* (2013.01); *H01L 2224/45015* (2013.01); *H01L 2224/45124* (2013.01); *H01L 2224/45144* (2013.01); *H01L 2224/4813* (2013.01);
(Continued)

(58) Field of Classification Search
CPC ........ H05B 6/6467; H05B 6/68; H05B 6/681; G01R 21/12; H01L 23/66; H01L 24/49; H01L 24/45; H01L 24/48; H01L 2223/664; H01L 2223/6611; H01L 2223/6655; H01L 2224/45015; H01L 2224/45124; H01L 2224/45144; H01L 2224/48091; H01L 2224/4813; H01L 2224/49175; H01L 2224/451; H01P 5/185; H03F 1/565; H03F 3/195; H03F 3/213; H03F 2200/451; H03F 2200/465; H03F 2203/21139; H03F 2203/21163; H03H 7/38
USPC ........................................................ 219/709
See application file for complete search history.

(56) References Cited

U.S. PATENT DOCUMENTS 5,994,965 A 11/1999 Davis et al.
6,784,405 B2 8/2004 Flugstad et al.
(Continued)

FOREIGN PATENT DOCUMENTS

WO 2006/067705 A1 6/2006

*Primary Examiner* — Craig M Schneider
*Assistant Examiner* — David R Deal

(57) ABSTRACT

A device includes an output circuit that includes an input port at which a signal is received, an output port at which an impedance-adjusted representation of the signal is provided, and a set of bond wires connecting the input and output ports. The device further includes first and second couplers, each including a respective coupling bond wire along the set of bond wires for inductive coupling with the set of bond wires. The first coupler is oriented relative to the distributed-element output circuit to measure forward power provided by the impedance-adjusted representation of the signal via the output port. The second coupler is oriented relative to the output circuit to measure reflected power received via the output port.

21 Claims, 3 Drawing Sheets

(51) Int. Cl.
   *H03F 3/213*   (2006.01)
   *H03F 3/195*   (2006.01)
   *H01L 23/66*   (2006.01)
   *H05B 6/68*    (2006.01)
   *G01R 21/12*   (2006.01)
   *H01L 23/00*   (2006.01)
   *H01P 5/18*    (2006.01)
   *H03F 1/56*    (2006.01)

(52) U.S. Cl.
   CPC .............. *H01L 2224/48091* (2013.01); *H01L 2224/49175* (2013.01); *H03F 2200/451* (2013.01); *H03F 2200/465* (2013.01); *H03F 2203/21139* (2013.01); *H03F 2203/21163* (2013.01)

(56) References Cited

U.S. PATENT DOCUMENTS

| | | | |
|---|---|---|---|
| 8,207,479 B2 | 6/2012 | Ben-Shmuel et al. | |
| 8,324,540 B2* | 12/2012 | Nordh | H05B 6/68 219/702 |
| 9,161,394 B2* | 10/2015 | Carlsson | H05B 6/705 |
| 9,215,756 B2* | 12/2015 | Bilchinsky | H05B 6/705 |
| 9,398,646 B2* | 7/2016 | Nobue | H05B 6/686 |
| 9,628,032 B1* | 4/2017 | Marbell | H03F 1/565 |
| 2006/0081624 A1 | 4/2006 | Takada et al. | |
| 2010/0188164 A1 | 7/2010 | Blednov | |
| 2011/0148543 A1* | 6/2011 | Bandholz | H01L 22/20 333/32 |
| 2012/0122072 A1 | 5/2012 | Bilchinsky et al. | |
| 2013/0015924 A1* | 1/2013 | Andre | H01L 23/642 333/32 |
| 2014/0132355 A1* | 5/2014 | Dupuis | H03F 3/195 330/298 |
| 2015/0041458 A1* | 2/2015 | Muto | H05B 6/808 219/709 |
| 2015/0053671 A1* | 2/2015 | Kurita | H05B 6/686 219/709 |
| 2015/0351164 A1 | 12/2015 | Wesson et al. | |
| 2016/0099220 A1* | 4/2016 | Atesal | H01L 23/645 257/664 |
| 2017/0279419 A1* | 9/2017 | Goel | H03F 1/565 |

* cited by examiner

POWER MEASUREMENT VIA BOND WIRE COUPLING

FIELD OF INVENTION

The present embodiments relate to amplifiers.

BACKGROUND

Amplifiers use power transistor devices to develop an amplified version of an input signal. The input signal is often modulated to carry information. To avoid distortion or other loss of the information, the power transistor device is configured and operated to amplify the input signal in a linear manner.

Power transistor devices are often controlled to improve operational characteristics. For instance, a power transistor device may be controlled to limit the input signal or bias voltages to levels at which the power transistor device operates in an efficient and linear manner. In linearization control schemes, the output power of the power transistor device is often monitored. Output monitoring is used to ensure that the modulation component of the input signal in the amplified output signal is acceptably linear.

Radio frequency (RF) power couplers are used for power monitoring. Some RF power couplers are installed to monitor the forward power delivered to the load. The forward power level measurement may then be used in a feedback loop to control the power transistor device.

RF power couplers are also installed to monitor the reflected power from the load. Such monitoring may be used to protect the power transistor devices from failure during output mismatch. Output mismatch arises with an offset in the output impedance of the amplifier and the input impedance of the load. The amount of output mismatch is identified by monitoring the power reflected from an output load.

RF power couplers often use distributed transmission lines and lumped-element networks. In such cases, the transmission lines may become undesirably long in connection with, for instance, quarter-wavelength transmission lines. For example, a transmission line on the surface of a substrate with a limited dielectric constant can be relatively long for an operating frequency of 2 Gigahertz (GHz). Even with a substrate having a relatively high permittivity, for example, a permittivity equal to about 10, a transmission line length will be of the order of 20 millimeters (mm).

For these reasons, RF power couplers have consumed a significant amount of space, e.g., on a printed circuit board. RF power couplers may also introduce undesirably long time delays in the output signal when being used for power control or linearization.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Figure 1:
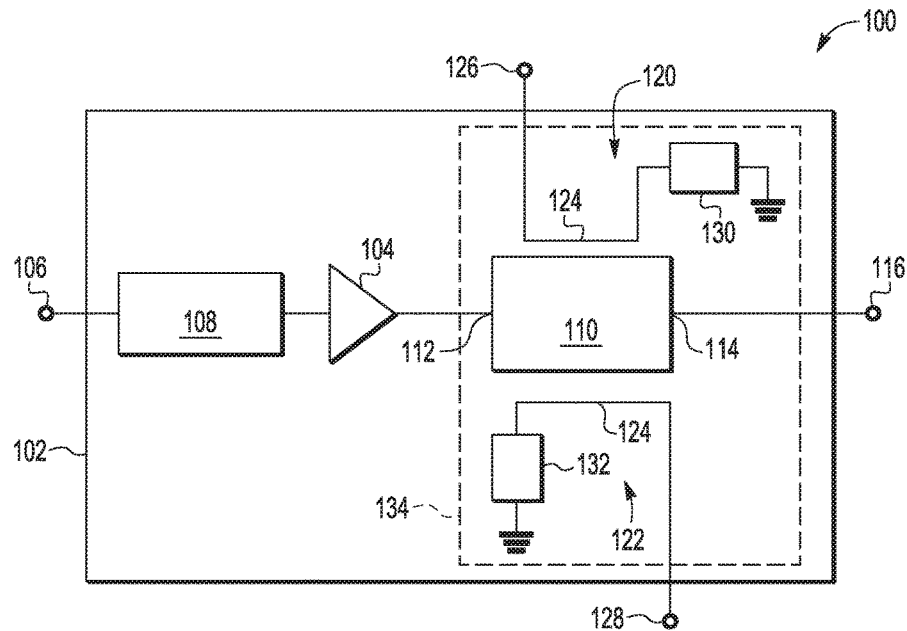
FIG. 1 is a schematic, block diagram view of a power amplifier device with power measurement via bond wire coupling in accordance with one embodiment.

Embodiments of power measurement devices with bond wire-based couplers are described, along with methods of measuring power with coupling bond wires. The devices include power measurement (or monitoring) devices, or power sensors, as well as power amplifier devices including such power measurement devices or power sensors. The power measurement devices include two couplers: one coupler for monitoring forward power and another coupler for monitoring reflected power. Each coupler includes a coupling bond wire inductively coupled to a set of bond wires connecting input and output ports of the power measurement device.

The bond wire-based couplers of the disclosed devices allow a bidirectional coupler to be realized in a compact and effective manner. For instance, both forward power and reflected power are monitored with high directivity, or isolation between forward and reflected power output ports. Effective monitoring of both forward power and reflected power is also achieved without relying on lumped elements in either the bond wire-based couplers or an output circuit (e.g., an impedance adjustment circuit or impedance matching circuit) with which the bond wire-based couplers are inductively coupled. For instance, neither the output circuit nor the bond wire-based couplers rely on adding lumped elements. Instead, the intrinsic and parasitic capacitance or inductance of the devices is sufficient. The output circuit and the bond wire-based couplers are accordingly capable of being fabricated and assembled in a compact manner.

The use of the intrinsic and parasitic inductances and capacitances present in the devices allows the amplifier devices, and the power measurement devices thereof, to be provided as a discrete, packaged device. For example, the amplifier device may be provided with integrated power measurement in a single, discrete RF power module. A device with a compact form factor may thus be attained.

The amplifier devices may be used in connection with RF power in the microwave bands, such as power at about 2.45 GHz (or other frequencies) for microwave heating. However, the disclosed devices are well suited for use in a wide variety of other applications and usage scenarios, including applications at other frequencies. For instance, the RF power amplified and otherwise handled by the disclosed devices may be used in various types of communication applications. The forward and reflected power may accordingly be representative of information or content via various modulation schemes.

The amplifier devices described below may be used in applications involving multiple amplifier devices, such as microwave systems. For example, a heating cavity of a microwave system may use four power amplifiers, or some other number of power amplifiers. In such cases, a non-operational one of the power amplifier devices may be especially susceptible to damage when all of the other power amplifiers are operational. The reflected power measurements may alternatively or additionally be representative of power delivered by the other power amplifiers but not absorbed by the load.

FIG. 1 depicts an amplifier device 100 in accordance with one example. The amplifier device 100 may be a power amplifier device configured to amplify RF signals. The amplifier device 100 may be a discrete device. In the example of FIG. 1, the device 100 is enclosed in a package 102, e.g., as a packaged semiconductor device. The package 102 may be an overmolded package with a lead frame having one or more die pads on which components of the amplifier device 100 are mounted. Alternatively, the package 102 may be an air cavity package with a flange on which components of the amplifier device 100 are mounted, and leads that provide electrical connectivity with circuits outside of the air cavity. The assembly of the components of the device 100 within the package 102 and other characteristics of the package 102 may vary. One or more components of the device 100 may be implemented in semiconductor die, and/or may be discrete devices (e.g., discrete, packaged devices) disposed within the package 102.

The device 100 includes a transistor device 104. The transistor device 104 may be a power transistor device. The transistor device 104 may be realized on a semiconductor die. The transistor device 104 may be integrated with one or more other components of the device 100. In some cases, the transistor device 104 may be or include one or more field-effect transistor (FET) devices, such as a laterally-diffused metal-oxide-semiconductor (LDMOS) transistor device. Other types of FET devices may be used, including, for instance, heterojunction FET (HFET) devices and other types of high electron mobility transistor (HEMT) devices. Alternatively, the transistor device 104 is or includes a bipolar junction transistor (BJT) device. Still other types of transistor devices may be used, including, for instance, heterojunction bipolar transistor (HBT) devices. The configuration, construction, and other characteristics of the transistor device 102 may vary.

The transistor device 104 is connected to an input lead or other input terminal 106 of the device 100 via an input circuit 108. An RF signal to be amplified by the device 100 is received at the input terminal 106. The input circuit 108 may be or include an input matching circuit. The input matching circuit may be configured to match (e.g., sufficiently match) the input impedance of the device 100 to the output impedance of a source of the RF signal received at the input terminal 106. Other types of pre-matching circuits may be used. In various embodiments, all or portions of the input circuit 108 may be integrated with the transistor device 104 or may be formed from components that are distinct from the transistor device 104. Alternatively, the transistor device 104 is configured to present an input impedance that matches the output impedance of the signal source, or vice versa.

The transistor device 104 is configured to generate an amplified representation of an input signal received at the input terminal 106 ("the amplified signal"). The input signal may be a voltage signal or a current signal. In some cases, the transistor device 104 is configured for operation as a transconductance amplifier such that the amplified signal is a current signal generated from an input voltage signal. In other cases, the amplified signal is a voltage signal. The term "signal" is used herein in a broad sense to include any type of electrical waveform regardless of whether the waveform is modulated or otherwise indicative of information.

The amplifier device 100 includes an output circuit 110 coupled to the transistor device 104 to receive the amplified signal. The output circuit 110 includes an impedance adjustment circuit, an input port 112 at which the amplified signal is received, and an output port 114 at which an impedance-adjusted representation of the amplified signal is provided.

The impedance adjustment provided by the circuit 110 may, for instance, address the low output impedance of the transistor device 104 in connection with a load having a higher input impedance. In that case, the output circuit 110 establishes a different (e.g., higher) output impedance for the amplifier device 100. As will be described later in conjunction with FIG. 2, the output circuit 110 includes a plurality of bond wires (e.g., bond wires 136, FIG. 2) that convey signals between the transistor device 104 and an output port 116.

In the example of FIG. 1, an output terminal of the transistor device 104 is electrically tied to the input port 112 of the output circuit 110. In other cases, the transistor device 104 and the output circuit 110 are coupled to one another by an intervening circuit, network, or other element.

The amplifier device 100 includes an output port 116 to which the output circuit 110 is coupled. The output port 116 may be an output pin, lead, or other node to which a load to be driven by the amplifier device 100 can be connected. In the example of FIG. 1, the output port 116 corresponds with the output port 114 of the output circuit 110. In other cases, one or more intervening circuits, networks, or other elements may be disposed between the output port 114 of the output circuit 110 and the output port 116 of the amplifier device 100.

The output circuit 110 may be or include an impedance matching circuit configured to establish an impedance of the amplifier device 100. The impedance may be an output impedance for the output port 112 of the amplifier device 100. A load attached or otherwise coupled to the output port 112 exhibits an input impedance that may be lower or higher than the output impedance of the transistor device 104. The output circuit 110 is then configured to adjust the output impedance of the amplifier device 100 at the output port 112 to match the input impedance of the load. The terms "match" and any derivatives thereof are used in a broad sense to include impedances that are not exactly equal.

In the example of FIG. 1, the output circuit 110 is a distributed-element circuit. For example, the output circuit 110 does not include lumped elements, such as lumped element capacitors or lumped element resistors. The output circuit 110 thus establishes the impedance of the output port 112 without relying on lumped elements. For instance, the output circuit 110 does not rely on or otherwise introduce a lumped element-based phase shift between the signal generated by the transistor device 104 and the impedance-adjusted representation at the output port 112. The absence of lumped elements allows the output circuit 110 and the amplifier device 100 to be more compactly realized.

The output circuit 110 relies upon distributed elements rather than lumped elements to implement the impedance matching or other adjustment. The distributed elements may be intrinsic to the construction of the output circuit and/or parasitic in nature. As described below, at least one inductance of the output circuit 110 is provided by a set of bond wires. Capacitance of the output circuit 110 is provided by the parasitic capacitance between structural components of the output circuit 110 and a ground plane.

The output circuit 110 may be configured for impedance matching at a desired frequency or within a desired frequency range. In one example, the output circuit 110 is configured for impedance matching at a frequency of about 2.45 GHz, which corresponds with the frequency used in microwave heating applications. The frequency may vary, e.g., in accordance with the application, the load, or other usage scenario for the amplifier device 100. For instance, in other applications, the frequency may be above about 1.0

GHz. Other frequency ranges may include, for example, about 4.45 gigahertz (GHz)+/−5 percent. In one embodiment, for example, the frequency falls in a range of about 4.40 GHz to about 4.50 GHz.

The amplifier device 100 includes a pair of couplers 120, 122 for power monitoring, in an embodiment. Each coupler 120, 122 includes a respective bond wire 124 (or multiple bond wires) for inductive coupling with the output circuit 110. The coupler 120 is oriented relative to the output circuit 110 to measure forward power provided by the impedance-adjusted representation of the signal via the output ports 114, 116. The coupler 122 is oriented relative to the output circuit 110 to measure reflected power received via the output ports 114, 116. The orientations of the couplers 120, 122 are further described below in connection with measurement port and termination locations.

Each coupler 120, 122 includes a respective measurement port 126, 128 connected to one end of the respective coupling bond wire(s) 124. The end to which the measurement port 126, 128 is connected depends on whether forward or reflected power is being monitored. A signal indicative of the forward power is provided at the measurement port 126. As shown in FIG. 1, the measurement port 126 is connected to a proximal end of one of the bond wires 124. A signal indicative of the reflected power is provided at the measurement port 128. As shown in FIG. 1, the measurement port 128 is connected to a distal end of the other one of the bond wires 124. In the example of FIG. 1, the measurement ports 126, 128 are configured as output ports of the amplifier device 100. The measurement ports 126, 128 may be configured as pins, leads, or other output elements at which signals indicative of the forward and reflected power are made available.

Each coupler 120, 122 includes a respective termination 130, 132. Each termination 130, 132 is connected at the other end of the respective coupling bond wire 124 as shown in FIG. 1. Each termination 130, 132 may be configured as an impedance connected to ground. In some cases, ground is provided as a plane, such as a back plane of the package 102 or a conductive flange to which the components of device 100 are coupled. The ground connection may vary in accordance with the construction of the packaging 102 and other structural characteristics of the amplifier device 102.

The amount of impedance associated with each termination 130, 132 may be selected in accordance with one or more characteristics of the amplifier device 100, including, for instance, the impedance of the couplers 120, 122. For example, the impedance of each termination may fall in a range from about 100 Ohms to about 600 Ohms, such as about 350 Ohms, although the impedance may be higher or lower, as well.

The use of two distinct couplers 120, 122 allows for accurate and trouble-free measurement of both forward and reflected power. For instance, having a separate coupler for each measurement avoids having to rely on a phase differential to provide both measurements. The couplers 120, 122 may also have higher directivity than other techniques that rely on a single coupling to provide both forward and reflected power.

The couplers 120, 122 are useful in additional ways. For example, the couplers 120, 122 may be smaller than couplers utilizing discrete components or couplers that rely on a quarter-wavelength phase difference to measure both forward and reflected power. The configuration of the couplers 120, 122 may also help integrate the measurement components fit into particular applications or package implementations. The couplers 120, 122 also provide flexibility in the opportunity to adjust the terminations 130, 132 for use with different frequencies, thereby avoiding a redesign of the coupling spacing, bond wire length, and other component parameters or characteristics. The disclosed devices are thus compatible with a wide variety of applications and usage scenarios.

In the example of FIG. 1, the couplers 120, 122 are integrated within the package 102. The couplers 120, 122 may thus be enclosed in a package or otherwise integrated with the transistor device 104 and other components of the amplifier device 100. In other cases, one or more components of the amplifier device 100 are not disposed within the packaging 102. In such cases, each packaged, discrete component of the amplifier device 100, including the packaged device including the transistor device 104, may be disposed on a printed circuit board (PCB). For example, the components shown in FIG. 1 may be enclosed in the package 102, while one or more control circuits of the amplifier device 100, such as a feedback circuit responsive to the forward and/or reflected power, are separately housed and mounted on the PCB.

The couplers 120, 122 and the output circuit 110 may be considered a coupler device 134 for the transistor device 104. Each of the output circuit 110 and the couplers 120, 122 couples an output or other signal associated with the transistor device 104 to a respective one of the ports 116, 126, 128. Further details regarding the construction and assembly of the coupler device 134 are provided below in connection with FIG. 2.

Figure 2:
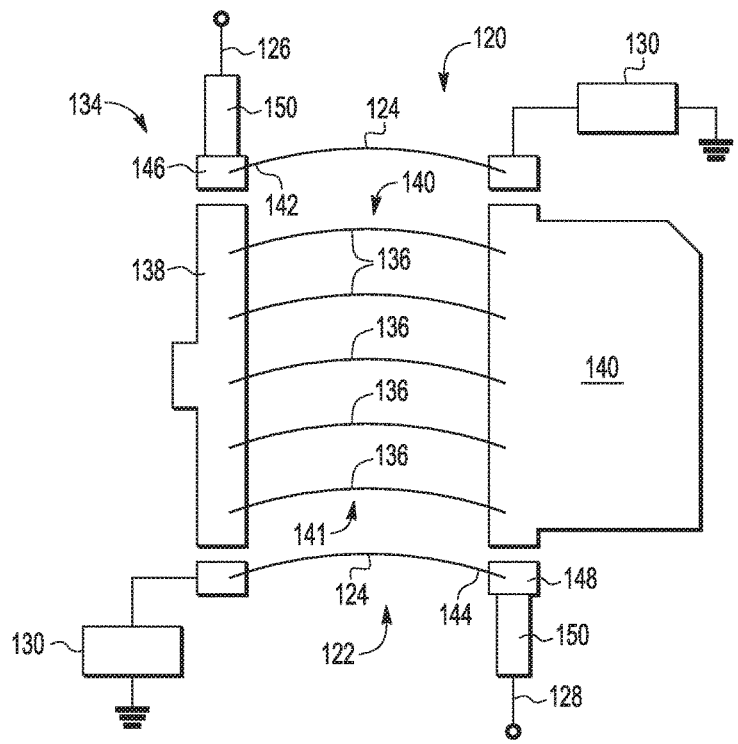
FIG. 2 is a schematic, plan view of a radio-frequency (RF) coupler device of the power amplifier device of FIG. 1 in accordance with one embodiment.

FIG. 2 depicts a coupler device 134 in accordance with one example in greater detail. The packaging 102 is not shown for ease in illustration of the components of the coupler device 134. The impedance adjustment elements of the coupler device 134 include a set of bond wires 136. Each bond wire 136 connects a die pad 138 and a packaging lead 140, which, in this example, correspond with the input port 112 of the output circuit 110 and the output port 116 of the amplifier device (FIG. 1). The bond wires 136 collectively provide a distributed inductance of the output circuit 110. A distributed capacitance of the output circuit 110 is provided by a parasitic capacitance between the die pad 138 and ground, such as the ground plane of the package 102 (FIG. 1).

The die pad 138 may constitute part of a transistor die on which the transistor device 104 (FIG. 1) is disposed or otherwise formed. For example, the die pad 138 may be or include one or more bond pads located along a periphery of the die. In some cases, the die pad 138 includes a metal layer supported by a substrate of the die. The metal layer may be spaced from a backside or other ground plane to establish the parasitic capacitance of the output circuit 110 (FIG. 1). In an embodiment, the die pad 138 is coupled to a current conducting terminal (e.g., a drain, in FET terminology) of the transistor device 104.

In the example of FIG. 2, the packaging lead 140 includes a rigid conductive structure that extends laterally outward from the package 102 (FIG. 1). In other examples, the coupler device 134 and, more generally, the amplifier device 100 (FIG. 1) may have an output port or terminal that has a different construction or configuration. For instance, one or more pins or pads may be used to provide the output of the coupler device 134 and, more generally, the amplifier device 100 (FIG. 1).

FIG. 2 depicts the bond wires 124 of the couplers 120, 122 in greater detail. Each bond wire 124 is positioned and configured to act as a coupling bond wire. As shown in FIG. 2, each bond wire 124 is positioned and oriented along the set of bond wires 136 of the output circuit 110 (FIG. 1). The positioning and orientation establishes the inductive coupling between the set of bond wires 136 and the bond wires 124. For instance, in some cases, the bond wires 124, 126 may be oriented such that more than one bond wire 124 may be used for each coupler 120, 122. The bond wires 124 may thus be in locations other than those shown in the example of FIG. 2. For instance, the bond wires 124 may be disposed above, below, and/or interdigitated with the bond wires 136.

The bond wires 124 may be disposed on opposite ends (or sides) of the set of bond wires 136 and, thus, more generally, the output circuit 110 (FIG. 1). As shown in the example of FIG. 2, the bond wire 124 for the coupler 120 is disposed along an end or side 140 of the array of bond wires 136. The bond wire 124 for the coupler 122 is disposed along an end or side 141 of the array of bond wires 136 opposite the end 140. In this way, the bond wires 124 for the couplers 120, 122 are adjacent to two different wire bonds 136. Also, the bond wires 124 are sufficiently spaced from one another to avoid any inductive coupling between the bond wires 124.

The measurement ports 126, 128 of the couplers 120, 122 are also shown in greater detail in FIG. 2. The measurement port 126 is connected to an end 142 of the bond wire 124 of the coupler 120 located adjacent the die bond pad 138. The measurement port 128 is connected to an end 144 of the bond wire 124 of the coupler 122. The terminations 130, 132 of the couplers 120, 122 are connected at ends of the bond wires 124 opposite those identified above.

The connections between the bond wires 124 and the measurement ports 126, 128 may be established at respective bond pads or other conductive structures 146, 148. In some cases, the conductive structures 146, 148 are parts of a packaging lead frame. A variety of other types of conductive structures and connections may be used, such as pins, pads, or other structures.

Each measurement port 126, 128 may include a transmission line 150 that extends laterally in a direction perpendicular to an orientation of the respective coupling bond wire 124. The perpendicular orientation of the transmission lines 150 avoids or minimizes any inductive coupling of the transmission lines 150 and the bond wires 124, 136. In the example of FIG. 2, each transmission line 150 is or includes a packaging lead or pin. The transmission line 150 may be configured or constructed differently from the example shown. For example, the transmission line 150 may be or include a bond wire, trace, or other conductive element.

The bond wires 124 of the couplers 120, 122 may have a configuration in common with each bond wire 136 of the output circuit 110 (FIG. 1). For instance, the bond wires 124, 136 may have the same diameter, composition, length (or span), and/or height (or vertical deflection). In some cases, the bond wires 124, 136 have a diameter of about 2 mils, an aluminum or gold composition, a length of about 60 mils, and a height of about 9 mils. But these and other parameters or characteristics may vary considerably.

One or more characteristics of the bond wires 124 may differ from the bond wires 136. For instance, adjacent bond wires 136 may be spaced apart by a distance shorter than a spacing between each bond wire 124 and the closest bond wire 136, or alternatively by a distance longer than a spacing between each bond wire 124 and the closest bond wire 136. In addition, the heights of bond wires 124 may be different from the heights of bond wires 136. In one example, the spacing of adjacent bond wires 136 is about 8 mils, while the spacing between the bond wire 124 and closest bond wire 134 is about 10 mils. These and other dimensions may be set to attain a desired amount of coupling for the couplers 120, 122 and/or inductance in the output circuit 110 (FIG. 1). The dimensions may vary from the above examples for these and other reasons. For instance, the distances between the bond wires 124, 136 may vary by +/−5% or more.

The configuration of the bond wires 136 and other components of the coupler 134 may exhibit sufficient power coupling for the couplers 120, 122, but without introducing a significant phase difference between the input port 112 (FIG. 1) and the output port 114 (or 116). For example, the phase difference between the input and output ports 112, 114 may be less than about 10 degrees (e.g., about 9 degrees), although it may be more than 10 degrees, as well.

The use of the intrinsic and parasitic inductance and capacitance of the bond wire arrangement allows the impedance of the input port 112 (FIG. 1) to be fairly low. For example, the input port impedance may be about 10 Ohms, or some other value. That impedance may be sufficiently close to the output impedance of the transistor device 104 (FIG. 1).

Figure 3:
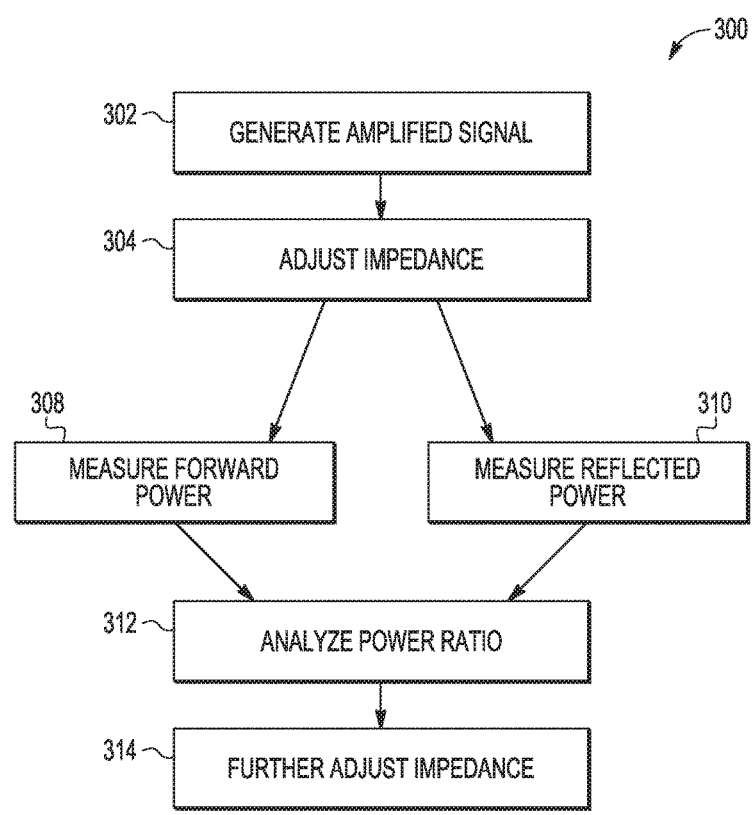
FIG. 3 is a flow diagram of a method of measuring forward power and reflected power via bond wire-based power measurement in accordance with one embodiment.

FIG. 3 shows a method 300 of measuring forward power and reflected power for a power amplifier device. The method may be implemented using one or more of the above-described devices. The method includes a sequence of acts, only the salient of which are depicted for convenience in illustration.

The method 300 may begin with one or more acts directed to providing the above-described devices. For example, an amplifier device configured in accordance with one of the above-described examples may be connected and configured for operation with a load. The connections may include connections at the above-described input and output ports as well as at other ports or terminals, such as bias voltage terminal connections. The connections may also include connections at two ports for power measurement or monitoring of forward and reflected power.

The method 300 may alternatively or additionally begin with one or more acts directed to providing an input signal. The input signal may be provided by one or more signal sources. Multiple signal sources may be used to provide a composite input signal having an RF signals modulated with one or more low frequency (e.g., DC) signals.

The method 300 includes an act 302 in which an amplified signal is generated with a transistor device of the power amplifier based on an input signal (e.g., a signal provided to a gate of the transistor device, in FET terms). In some cases, the amplified signal may be a current signal generated from a control voltage or current. The act 302 may include applying a bias voltage to the transistor device. The act 302 may also include implementing various control schemes. For instance, a control scheme may be directed to setting the bias voltage and/or controlling the input signal.

An output impedance of the power amplifier is adjusted for the generated signal in an act 304 via a distributed-element impedance matching circuit. The output impedance adjustment may involve or include matching an impedance of a load. The matching or other adjustment is realized without a lumped element-based phase shift in the generated signal. As described above, lumped elements are not relied upon to implement the impedance adjustment and/or phasing. Instead, the matching or other adjustment is achieved with one of the above-described bond wire-based circuits. The intrinsic inductance of the bond wires and parasitic capacitance of the circuits is capable of attaining a desired impedance adjustment for a selected frequency or frequency range, such as 2.45 GHz or some other frequency.

Measurements of forward and reflected power are developed in acts 308, 310. The measurements are developed using the inductive coupling of respective coupling bond wires with the set of bond wires of the inductance adjustment circuit. The acts 308, 310 may thus be concurrently implemented with the acts 304. The forward and reflected power measurements are provided at respective measurement ports, as described above.

In the example shown in FIG. 3, the power measurements are used in an act 312 to analyze one or more parameters indicative of the operation of power amplifier device. The parameter(s) are then used to further adjust the output impedance or otherwise control operation in an act 314. For example, the act 312 may include calculating a reflected to forward power ratio with the measurements obtained in the acts 308, 310, and comparing the ratio with a threshold. If the threshold is exceeded, then the output impedance is further adjusted in the act 314. Examples of these and other applications of the power measurements are provided in connection with FIGS. 4 and 5. The act 312 may include or involve alternative or additional calculations and analyses, and the act 314 may include alternative or additional control adjustments.

The ordering of the acts may vary in other embodiments. For example, the output generation of the act 302 may follow the development of the power measurements in cases in which the power measurements are used to configure or otherwise control the operation of the power amplifier device.

Additional, fewer, or alternative acts may be implemented. For example, the method 300 may include one or more acts directed to using the forward and reflected power measurements.

Embodiments of a power amplifier device (e.g., amplifier device 100) and/or embodiments of an RF coupler device (e.g., coupler device 134) may be incorporated into various types of systems. For example, but not by way of limitation, such embodiments may be incorporated into RF solid-state heating systems (e.g., system 400, FIG. 4), as or in connection with power detection circuits or circuitry of such systems in accordance with various example embodiments.

Figure 4:
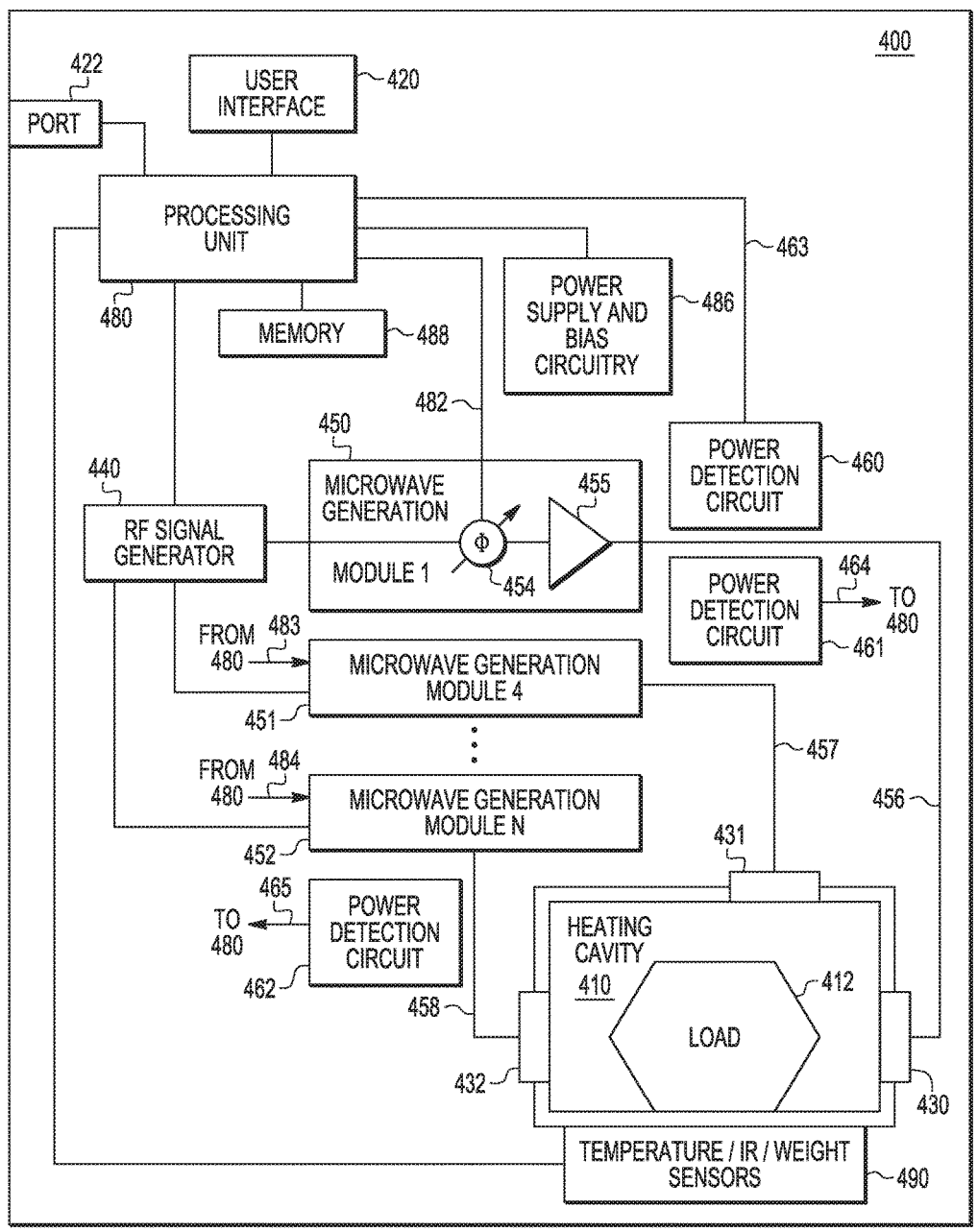
FIG. 4 is a schematic, block diagram view of a microwave system having a power detection circuit with bond wire coupling in accordance with one embodiment.

FIG. 4 is a simplified block diagram of a solid-state heating system 400 that includes one or more amplifier devices (e.g., amplifier device 100) or and/or coupler devices (e.g., coupler device 134), in accordance with an example embodiment. Solid-state heating system 400 includes heating cavity 410, user interface 420, N microwave energy radiators 430-432 (e.g., N may be any integer from 4 to 10 or more), RF signal generator 440, N microwave generation modules 450-452, N power detection circuits 460-462, a processing unit 480, power supply and bias circuitry 486, and memory 488, in an embodiment. In addition, in some embodiments, solid-state heating system 400 may include temperature sensor(s), infrared (IR) sensor(s), and/or weight sensor(s) 490, although some or all of these sensor components may be excluded. It should be understood that FIG. 4 is a simplified representation of a solid-state heating system 400 for purposes of explanation and ease of description, and that practical embodiments may include other devices and components to provide additional functions and features, and/or the solid-state heating system 400 may be part of a larger electrical system.

Heating cavity 410, which is configured to contain a load 412 to be heated, is defined by the interior surfaces of bottom, top, and side walls. According to an embodiment, the cavity 410 may be sealed (e.g., with a door) to contain the electromagnetic energy that is introduced into the cavity 410 during a heating operation. The system 400 may include one or more interlock mechanisms that ensure that the seal is intact during a heating operation. If one or more of the interlock mechanisms indicates that the seal is breached, the processing unit 480 may cease the heating operation.

Heating cavity 410 and any load 412 (e.g., food, liquids, and so on) positioned in the heating cavity 410 present a cumulative load for the electromagnetic energy (or RF power) that is radiated into the cavity 410 by the N microwave energy radiators 430-432. More specifically, the cavity 410 and the load 412 present an impedance to the system, referred to herein as a "cavity input impedance." The cavity input impedance changes during a heating operation as the temperature of the load 412 increases.

User interface 420 may include a control panel, for example, which enables a user to provide inputs to the system regarding parameters for a heating operation (e.g., characteristics of the load to be heated, duration of heating operation, and so on), start and cancel buttons, mechanical controls (e.g., a door/drawer open latch), and so on. In addition, the user interface 420 may be configured to provide user-perceptible outputs indicating the status of a heating operation (e.g., a countdown timer, visible indicia indicating progress or completion of the heating operation, and/or audible tones indicating completion of the heating operation) and other information. In some embodiments, communication with the system 400 also may be implemented using a data port 422, which may be configured to convey commands and other information between an external system (e.g., external computer 180, FIG. 1) and the system 400 (e.g., the processing unit 480).

Processing unit 480 may include one or more general purpose or special purpose processors (e.g., a microprocessor, microcontroller, Application Specific Integrated Circuit (ASIC), and so on), volatile and/or non-volatile memory (e.g., Random Access Memory (RAM), Read Only Memory (ROM), flash, various registers, and so on), one or more communication busses, and other components. According to an embodiment, processing unit 480 is coupled to user interface 420, data port 422 (if included), RF signal generator 440, microwave power generation modules 450-452, power detection circuits 460-462, power supply and bias circuitry 486, and sensors 490 (if included). Processing unit 480 is configured to receive signals indicating inputs received via user interface 420 and/or port 422, to receive signals indicating temperature and/or weight via sensors 490 (when included), and to receive forward and reflected power measurements from power detection circuit 460-462 over connections 463-465. Based on the input signals received from user interface 420, port 422, and sensors 490, processing unit 480 determines a combination of excitation signal parameters, and provides control signals to the RF signal generator 440 and microwave generation modules 450-452, which indicate the one or more determined excitation signal parameters. As used herein, an "excitation signal" is an RF signal provided by any microwave power generation module 450-452 over a connection 456-458 to a microwave energy radiator 430-432. An "excitation signal parameter" is an electrical characteristic of an excitation signal, including but not by way of limitation, a frequency of an excitation signal, a phase shift of an excitation signal with respect to another instance of the excitation signal, a power level of an excitation signal, or another electrical characteristic of an excitation signal.

For example, an excitation signal parameter may be a frequency or a range of frequencies at which the RF signal generator 440 should provide RF signals to the microwave power generation modules 450-452. Upon determining a frequency or range of frequencies based on the input signals received from user interface 420, port 422, and/or sensors 490, processing unit 480 may provide a control signal to RF signal generator 440 indicating the determined frequency or range of frequencies. In response to the received control signal(s), the RF signal generator 440 produces an excitation signal at the indicated frequency or within the indicated range of frequencies. According to an embodiment, the RF signal generator 440 may be configured to produce an oscillating electrical signal having a frequency in the ISM (industrial, scientific, and medical) band, although the system could be modified to support operations in other frequency bands, as well. In the illustrated embodiment, only a single RF signal generator 440 is shown. In alternate embodiments, system 400 may include multiple RF signal generators (e.g., N RF signal generators), each of which receive control signals from the processing unit 480. Either way, each RF signal generator 440 may be controlled to produce oscillating signals of different power levels and/or different frequencies, in various embodiments. For example, the RF signal generator 440 may produce a signal that oscillates above about 1.0 GHz. Some desirable frequency ranges may include, for example, about 4.45 gigahertz (GHz)+/−5 percent. In one particular embodiment, for example, the RF signal generator 440 may produce a signal that oscillates in a range of about 4.40 GHz to about 4.50 GHz and at a power level in a range of about 10 decibels (dB) to about 15 dB. Alternatively, the frequency of oscillation and/or the power level may be lower or higher than the above-given ranges or values.

In addition to excitation signal frequency, an excitation signal parameter may be a phase shift to be applied by a microwave power generation module 450-452 to an excitation signal received from the RF signal generator 440. In an embodiment, each microwave power generation module 450-452 includes a variable phase shifter 454 (only one shown) coupled in series with an amplifier 455 (only one shown). Upon determining phase shifts for each of the microwave generation modules 450-452 based on the input signals received from user interface 420, port 422, and/or sensors 490, processing unit 480 may provide control signals to the phase shifter 454 within each of the microwave power generation modules 450-452 over connections 482-484, which indicate phase shifts to be applied by the phase shifters 454 to the RF signals received from the RF signal generator 440. In response to the received control signal(s), the phase shifters 454 apply corresponding phase shifts to the excitation signals received from the RF signal generator 440.

FIG. 4 shows the variable phase shifter 454 having an input coupled to the RF signal generator 440, and an output coupled to the amplifier 455 (i.e., the phase shifter 454 is coupled between the generator 440 and the amplifier 455). In an alternate embodiment, the amplifier 455 may be coupled between the RF signal generator 440 and the variable phase shifter 454 (i.e., an input to the amplifier 455 may be coupled to the signal generator 440, and an output of the amplifier 455 may be coupled to the input to the phase shifter 454). Either way, the input of each microwave power generation module 450-452 is coupled to the RF signal generator 440, and the output each microwave power generation module 450-452 is coupled to a microwave energy radiator 430-432 through a transmission line 456-458.

In the illustrated series configuration, the variable phase shifter 454 is configured to receive an RF signal from the RF signal generator 440, and to apply a phase shift to the signal that corresponds to a phase shift indicated in a control signal received over one of connections 482-484 from the processing unit 480. The amplifier 455 receives the phase shifted RF signal from the variable phase shifter 454 (or an unshifted signal if a phase shift of 0 degrees was imparted), and amplifies the RF signal to produce an amplified and potentially phase shifted output RF signal. Each amplifier 455 may be implemented using any of a variety of amplifier topologies. For example, each amplifier 455 may include various embodiments of a single ended amplifier, a double ended amplifier, a push-pull amplifier, a Doherty amplifier, a Switch Mode Power Amplifier (SMPA), or another type of amplifier.

Each power amplifier 455 may be implemented as a single-stage or a multi-stage power amplifier (e.g., including a driver amplifier stage and a final amplifier stage). The power amplifier 455 is configured to receive the oscillating signal from the variable phase shifter 454 (or from the RF signal generator 440 if the series configuration is reversed), and to amplify the signal to produce a significantly higher-power signal at an output of the power amplifier 455. For example, the output signal may have a power level in a range of about 100 watts to about 400 watts or more.

The gain applied by the power amplifier 455 may be controlled using gate bias voltages and/or drain supply voltages provided by the power supply and bias circuitry 486 to each stage of the amplifier 455. More specifically, power supply and bias circuitry 486 may provide bias and supply voltages to each RF amplifier stage in accordance with control signals received from processing unit 480. Thus, according to a further embodiment, processing unit 480 may provide control signals to power supply and bias circuitry 486, which cause the circuitry 486 to adjust the gate and/or drain bias voltages provided to amplifiers 455 within the microwave power generation modules 450-452.

In an embodiment, each amplifier stage is implemented as a power transistor, such as a field effect transistor (FET), having an input terminal (e.g., a gate or control terminal) and two current carrying terminals (e.g., source and drain terminals). For a single stage amplifier, impedance matching circuits (not illustrated) may be coupled to the input (e.g., gate) of the single amplifier stage, and/or to the output (e.g., drain terminal) of the single amplifier stage. For a two-stage amplifier, impedance matching circuits (not illustrated) may be coupled to the input (e.g., gate) of the driver amplifier stage, between the driver and final amplifier stages, and/or to the output (e.g., drain terminal) of the final amplifier stage, in various embodiments. In an embodiment, the power transistor of each amplifier stage includes a laterally diffused metal oxide semiconductor FET (LDMOSFET) transistor. However, it should be noted that the transistors are not intended to be limited to any particular semiconductor technology, and in other embodiments, each transistor may be realized as a gallium nitride (GaN) transistor, another type of MOSFET transistor, a bipolar junction transistor (BJT), or a transistor utilizing another semiconductor technology.

Each amplified and potentially phase shifted RF signal produced by a microwave power generation module 450-452 is provided over a transmission path 456-458 to one of the N microwave energy radiators 430-432. For example, each of the transmission paths 456-458 may include an impedance matching network and a conductor (e.g., a coaxial cable or other type of conductor).

According to an embodiment, a power detection circuit 460-462 is coupled along each transmission path 456-458 between the output of each microwave power generation module 450-452 and the input to each microwave energy radiator 430-432. For example, each power detection circuit

460-462 may include a coupler device (e.g., coupler device 134). Each power detection circuit 460-462 is configured to monitor, measure, or otherwise detect the power of the forward signals (i.e., from one of the microwave generation modules 450-452 toward one of the N microwave energy radiators 430-432), and the power of the reflected signals (i.e., from one of the N microwave energy radiators 430-432 toward one of the microwave generation modules 450-252) traveling along the transmission paths 456-458.

Power detection circuits 460-462 supply signals conveying the magnitudes of the forward and reflected signal power (and possibly the forward signal power) to processing unit 480 over connections 463-465. For example, referring also to FIGS. 1 and 2, the signals may be conveyed through ports 126, 128, as previously discussed. Processing unit 480, in turn, may calculate a ratio of reflected signal power to forward signal power and/or return loss from the received measurements. The processing unit 480 may then modify RF excitation signal parameters in order to find combinations of excitation signal parameters that result in acceptable or optimal reflected power and/or return loss.

As mentioned above, some embodiments of solid-state heating system 400 may include temperature sensor(s), IR sensor(s), and/or weight sensor(s) 490 that may be useful in determining load characteristics. The temperature sensor(s) and/or IR sensor(s) may be positioned in locations that enable the temperature of the load 412 to be sensed during the heating operation. When provided to the processing unit 480, the temperature information enables the processing unit 480 to select a combination of excitation signal parameters, to alter the power of the RF signal supplied by the RF signal generator 440 (e.g., by controlling the bias and/or supply voltages provided by the power supply and bias circuitry 486), and/or to determine when a heating operation should be terminated. The weight sensor(s) are positioned under the load 412, and are configured to provide an estimate of the weight of the load 412 to the processing unit 480. The processing unit 480 may use this information, for example, to select a combination of excitation signal parameters, to determine a desired power level for the RF signal supplied by the RF signal generator 440, and/or to determine an approximate duration of a heating operation.

Other combinations of the various features and aspects of the embodiments described above may also be provided. For example, one or more features or aspects of one embodiment may be combined with one or more features or aspects of another embodiment, even though the resulting combination is not expressly described or identically shown in the figures.

Described above are power amplifier and other devices having a bidirectional coupler for monitoring forward and reflected power, with high directivity. The power measurement is realized by additional bond wires that are inductively coupled to bond wires used to couple a power transistor device to an output port in connection with signal output, impedance matching or other adjustment. The power monitoring may be achieved without imposing any phasing adjustments or other phase differences on output impedance matching circuitry or the circuitry used to provide the bidirectional coupler.

Although described as useful in connection with RF power devices, the disclosed devices may be useful in a variety of other applications. The devices are not limited to any particular application or type of load.

In a first aspect, a device includes an output circuit that includes an input port at which a signal is received, an output port at which an impedance-adjusted representation of the signal is provided, and a set of bond wires connecting the input and output ports. The device further includes first and second couplers, each including a respective coupling bond wire along the set of bond wires for inductive coupling with the set of bond wires. The first coupler is oriented relative to the output circuit to measure forward power provided by the impedance-adjusted representation of the signal via the output port. The second coupler is oriented relative to the output circuit to measure reflected power received via the output port.

In a second aspect, a power amplifier includes a transistor device configured to generate a signal, and an output circuit that establishes an impedance of the power amplifier without a lumped element-based phase shift in the generated signal. The output circuit includes an input port at which the generated signal is received, an output port at which an impedance-adjusted representation of the generated signal is provided, and a set of bond wires connecting the input and output ports. The power amplifier further includes first and second couplers, each including a respective coupling bond wire along the set of bond wires for inductive coupling with the set of bond wires, a respective measurement port connected to a first end of the respective coupling bond wire, and a respective termination connected at a second end of the respective coupling bond wire. The first coupler is oriented relative to the output circuit to provide a first output on the respective measurement port indicative of forward power provided by the impedance-adjusted representation of the generated signal via the output port. The second coupler is oriented relative to the output circuit to provide a second output on the respective measurement port indicative of reflected power received via the output port.

In a third aspect, a method of measuring forward power and reflected power for a power amplifier includes generating a signal with a transistor device of the power amplifier, and adjusting an output impedance of the power amplifier for the generated signal via an output circuit, the output circuit including an input port at which the generated signal is received, an output port at which an impedance-adjusted representation of the generated signal is provided, and a set of bond wires connecting the input and output ports. The method further includes developing a forward power measurement at a first measurement port via inductive coupling between a first coupling bond wire inductively coupled with the set of bond wires, and developing a reflected power measurement at a second measurement port via inductive coupling between a second coupling bond wire inductively coupled with the set of bond wires.

In a fourth aspect, a solid-state system includes a heating cavity configured to contain a load to be heated, a transistor device configured to generate a signal to support introduction of energy into the heating cavity, an output circuit comprising an input port at which the generated signal is received, an output port at which a representation of the generated signal is provided, and a set of bond wires connecting the input and output ports, a power detection circuit including first and second couplers, each including a respective coupling bond wire along the set of bond wires for inductive coupling with the set of bond wires, the first coupler being oriented relative to the output circuit to measure forward power provided by the representation of the signal via the output port, and the second coupler being oriented relative to the output circuit to measure reflected power received via the output port, and a processing unit coupled to the power detection circuit to receive signals indicative of the measured forward power and the measured reflected power.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

What is claimed is:

1. A device comprising:
    an output circuit coupled to an output of a transistor device, the output circuit including
        an input port at which a signal is received,
        an output port at which an impedance-adjusted representation of the signal is provided, and
        a set of bond wires connecting the input and output ports;
    a first coupler including a first coupling bond wire positioned along the set of bond wires so that inductive coupling occurs between the first coupling bond wire and the set of bond wires, wherein the first coupler includes a first measurement port coupled to a first end of the first coupling bond wire, and a first termination coupled to a second end of the first coupling bond wire, and wherein a signal indicative of forward power between the input port and the output port is provided at the first measurement port; and
    a second coupler including a second coupling bond wire positioned along the set of bond wires so that inductive coupling occurs between the second coupling bond wire and the set of bond wires, wherein the second coupler includes a second measurement port coupled to a first end of the second coupling bond wire, and a second termination coupled to a second end of the second coupling bond wire, and wherein a signal indicative of reverse power between the output port and the input port is provided at the second measurement port.

2. The device of claim 1, wherein each of the first and second measurement port comprises a lead that extends laterally in a direction perpendicular to an orientation of the respective coupling bond wire.

3. The device of claim 1, wherein the output port comprises an output packaging lead.

4. The device of claim 1, wherein the input port comprises a transistor die bond pad.

5. The device of claim 1, wherein the respective coupling bond wires of the first and second couplers have a configuration in common with each bond wire of the set of bond wires.

6. The device of claim 1, wherein:
    the first coupling bond wire of the first coupler is disposed along a first end of the output circuit; and
    the second coupling bond wire of the second coupler is disposed along a second end of the output circuit.

7. The device of claim 1, wherein adjacent bond wires of the set of bond wires are spaced apart by a distance shorter than a spacing between each coupling bond wire and the set of bond wires.

8. The device of claim 1, further comprising a processing unit coupled to the first and second couplers to receive the signal indicative of the forward power and the signal indicative of the reflected power, the processing unit being configured to calculate a reflected to forward power ratio based on the signal indicative of the forward power and the signal indicative of the reflected power.

9. The device of claim 8, wherein the processing unit is further configured to compare the calculated reflected to forward power ratio with a threshold.

10. A power amplifier comprising:
    a transistor device configured to generate a signal;
    an output circuit that establishes an impedance of the power amplifier without a lumped element-based phase shift in the generated signal, the output circuit including
        an input port at which the generated signal is received,
        an output port at which an impedance-adjusted representation of the generated signal is provided, and
        a set of bond wires connecting the input and output ports;
    a first coupler including a first coupling bond wire positioned along the set of bond wires so that inductive coupling occurs between the first coupling bond wire and the set of bond wires, wherein the first coupler includes a first measurement port coupled to a first end of the first coupling bond wire, and a first termination coupled to a second end of the first coupling bond wire, and wherein a signal indicative of forward power between the input port and the output port is provided at the first measurement port; and
    a second coupler including a second coupling bond wire positioned along the set of bond wires so that inductive coupling occurs between the second coupling bond wire and the set of bond wires, wherein the second coupler includes a second measurement port coupled to a first end of the second coupling bond wire, and a second termination coupled to a second end of the second coupling bond wire, and wherein a signal indicative of reverse power between the output port and the input port is provided at the second measurement port.

11. The power amplifier of claim 10, further comprising a package in which the transistor device and the output circuit are disposed such that the first and second couplers are embedded within the package.

12. The power amplifier of claim 10, wherein each measurement port comprises a lead that extends laterally in a direction perpendicular to an orientation of the respective coupling bond wire.

13. The power amplifier of claim 10, wherein the output port comprises an output packaging lead.

14. The power amplifier of claim 10, wherein the input port comprises a die bond pad.

15. The power amplifier of claim 10, wherein the respective coupling bond wires of the first and second couplers have a configuration in common with each bond wire of the set of bond wires.

16. The power amplifier of claim 10, wherein:
    the respective coupling bond wire of the first coupler is disposed along a first end of the output circuit; and
    the respective coupling bond wire of the second coupler is disposed along a second end of the output circuit.

17. The power amplifier of claim 10, wherein adjacent bond wires of the set of bond wires are spaced apart from one another by a distance shorter than a spacing between each coupling bond wire and the set of bond wires.

18. A method of measuring forward power and reflected power for a power amplifier, the method comprising:

generating a signal with a transistor device of the power amplifier;
adjusting an output impedance of the power amplifier for the generated signal via an output circuit, the output circuit including
an input port at which the generated signal is received,
an output port at which an impedance-adjusted representation of the generated signal is provided, and
a set of bond wires connecting the input and output ports;
developing a forward power measurement at a first measurement port via inductive coupling between a first coupling bond wire positioned along and inductively coupled with the set of bond wires; and
developing a reflected power measurement at a second measurement port via inductive coupling between a second coupling bond wire positioned along and inductively coupled with the set of bond wires.

19. The method of claim 18, wherein adjusting the output impedance comprises matching a load impedance without a lumped element-based phase shift in the generated signal.

20. The method of claim 18, further comprising:
receiving the forward power measurement and the reflected power measurement;
calculating a reflected to forward power ratio based on the received forward and reflected power measurements;
comparing the reflected to forward power ratio with a threshold; and
further adjusting the output impedance if the threshold is exceeded.

21. A solid-state system comprising:
a heating cavity configured to contain a load to be heated;
a transistor device configured to generate a signal to support introduction of energy into the heating cavity;
an output circuit comprising an input port at which the generated signal is received, an output port at which a representation of the generated signal is provided, and a set of bond wires connecting the input and output ports;
a power detection circuit that includes
a first coupler including a first coupling bond wire positioned along the set of bond wires so that inductive coupling occurs between the first coupling bond wire and the set of bond wires, wherein the first coupler includes a first measurement port coupled to a first end of the first coupling bond wire, and a first termination coupled to a second end of the first coupling bond wire, and wherein a signal indicative of forward power between the input port and the output port is provided at the first measurement port, and
a second coupler including a second coupling bond wire positioned along the set of bond wires so that inductive coupling occurs between the second coupling bond wire and the set of bond wires, wherein the second coupler includes a second measurement port coupled to a first end of the second coupling bond wire, and a second termination coupled to a second end of the second coupling bond wire, and wherein a signal indicative of reverse power between the output port and the input port is provided at the second measurement port; and
a processing unit coupled to the power detection circuit to receive the signal indicative of the forward power and the signal indicative of the reflected power.

* * * * *